United States Patent [19]
Alvaro et al.

[11] Patent Number: 6,060,848
[45] Date of Patent: May 9, 2000

[54] SYSTEM FOR CONTROLLING A BRUSHLESS ELECTRIC MOTOR

[75] Inventors: Nicolino Alvaro, Turin; Sebastiano Acquaviva, Pino Torinese, both of Italy

[73] Assignee: Plaset Spa, Moncalieri, Italy

[21] Appl. No.: 09/232,154

[22] Filed: Jan. 15, 1999

[30] Foreign Application Priority Data

Jan. 15, 1998 [IT] Italy .................................. TO98A0028

[51] Int. Cl.$^7$ .................................................. H02K 23/00
[52] U.S. Cl. ........................ 318/254; 318/138; 318/439; 318/434
[58] Field of Search .................... 318/254, 439, 318/138, 434

[56] References Cited

U.S. PATENT DOCUMENTS

| | | | |
|---|---|---|---|
| 4,473,782 | 9/1984 | Reinhardt et al. | 318/254 |
| 4,578,623 | 3/1986 | Tsukutani et al. | 318/254 |
| 5,537,015 | 7/1996 | Karwath | 318/419 |
| 5,767,639 | 6/1998 | Sakaguchi et al. | 318/254 |

FOREIGN PATENT DOCUMENTS

| | | | |
|---|---|---|---|
| 0461066A1 | 5/1991 | European Pat. Off. | H02P 8/00 |
| 04049890 | 2/1992 | Japan | H02P 6/02 |

Primary Examiner—Karen Masih
Attorney, Agent, or Firm—Arnold White & Durkee

[57] ABSTRACT

The system comprises sensors (PS) for detecting the angular position of the rotor (R) of the motor and a driver circuit (DC) arranged to control conduction in the controlled switches (SW) associated with the phases (W) of the motor and in a regulation switch (RSW) in predetermined manner in dependence on the position signals emitted by the sensors (PS). The regulation switch (RSW) is driven in an on/off manner by means of a square-wave signal. The system further comprises a protection circuit (PC) with a capacitor (C) connected to the control input of the regulation switch (RSW) so that the capacitor (C) is charged each time the regulation switch (RSW) is made conductive by the square-wave signal in operation, and with a control switch (T) connected between the control input of the regulation switch (RSW) and a pole (GND) of the direct-current supply and having a control input connected to the capacitor (C). The control switch (T) is made conductive and cuts off the regulation switch (RSW) when the latter remains conductive continuously for a period of time longer than a predetermined period.

5 Claims, 3 Drawing Sheets

6,060,848

SYSTEM FOR CONTROLLING A BRUSHLESS ELECTRIC MOTOR

BACKGROUND OF THE INVENTION

The present invention relates to a system for controlling a brushless electric motor comprising a plurality of stator windings or phases which are arranged in respective circuit branches and each of which is in series with a corresponding controlled electronic switch, the circuit branches being connected, at one end, to one pole of a direct- current voltage supply and, at the other end, to the other pole of the supply, by means of an electronic regulation switch.

Such systems typically include generator means for supplying electrical signals indicative of the angular position of the rotor of the motor, and a driver circuit arranged to control conduction in the controlled switches associated with the phases of the motor and in the regulation switch in predetermined manner in dependence on the position signals emitted by the generator means, the regulation switch, in particular, being driven in an on/off manner by means of a square-wave control signal.

The object of the present invention is to provide a system of this type having improved characteristics.

SUMMARY OF THE INVENTION

This and other objects are achieved, according to the invention, by a system of the type specified above, characterized in that it includes a protection circuit including:

a capacitor coupled to the control input of the regulation switch so that the capacitor is charged each time the regulation switch is made conductive by the square-wave control signal in operation, and a control switch connected between the control input of the regulation switch and the other pole of the direct-current voltage supply and having a control input connected to the capacitor so that the control switch is made conductive and cuts off the regulation switch when the latter remains conductive continuously for a period of time longer than a predetermined period.

Among other things, the protection circuit of the control system according to the invention advantageously protects the regulation switch should the rotor of the motor be stopped in operation.

BRIEF DESCRIPTION OF THE DRAWINGS

Other objects and advantages of the invention will become apparent upon reading the following detailed description and upon reference to the drawings in which.

Figure 1:
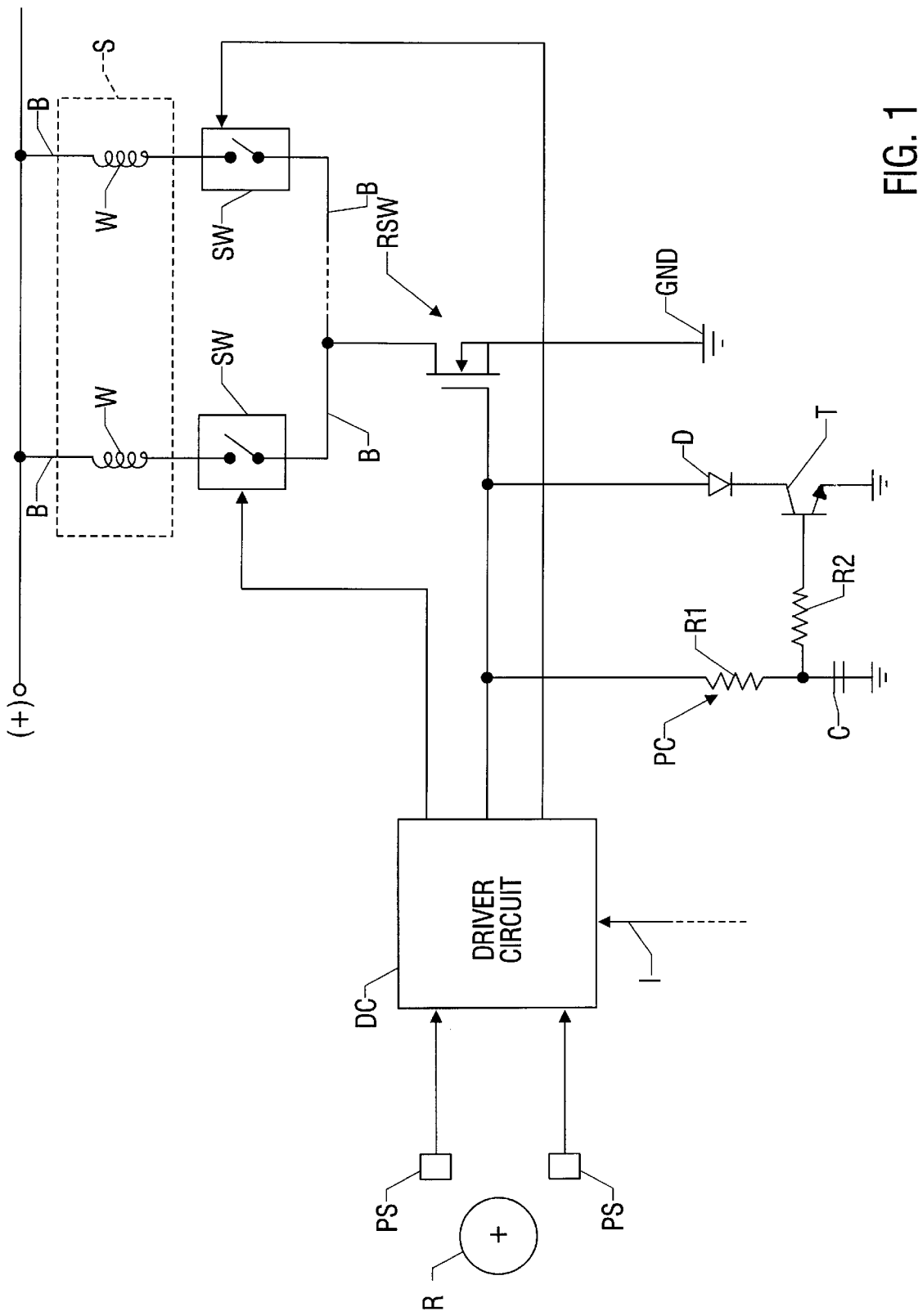
FIG. 1 is an electrical diagram, partially in block form, of a control system for a brushless electric motor according to the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 of the appended drawings shows, by way of example, a system for controlling a half-wave brushless electric motor comprising a rotor R and a stator S. The latter comprises a plurality of windings or phases W which are arranged in respective circuit branches B, and each of which is in series with a corresponding controlled electronic switch SW. These electronic switches may be constituted, for example, by SCRs.

The circuit branches B are connected, at one end, to one pole (+) of a direct-current voltage supply (not shown in FIG. 1) and, at the other end, to the other pole of the supply, that is, to ground GND, by means of an electronic regulation switch RSW, constituted, for example, by a MOSFET.

The control inputs of the switches SW associated with the phases W of the motor are connected to corresponding outputs of a driver circuit, generally indicated DC.

The regulation switch RSW also has a control input connected to a corresponding output of the driver circuit DC.

In the embodiment shown, the driver circuit DC has a plurality of inputs connected to electrical position sensors PS associated with the rotor R of the motor. These sensors may be constituted, for example, by Hall-effect sensors, photoelectric sensors, etc.

Although the embodiments described and illustrated provide for the use of position sensors associated with the rotor R, the invention is not intended to be limited to control systems using such sensors but also extends to control systems in which the angular position of the rotor R of the motor is inferred, for example, by analysis of the waveforms of the electromotive forces induced in the phases W of the stator S.

The driver circuit DC has an input I for an external signal indicative of the desired speed of rotation of the motor.

The driver circuit DC is arranged, in known manner, to control conduction in the switches SW and in the regulation switch RSW in dependence on the position signals emitted by sensors PS (or equivalent data relating to the position of the rotor obtained without the use of sensors), and on the input signal I.

The driver circuit DC is arranged, in particular, to drive the regulation switch in an on/off manner by means of a square-wave signal.

A protection circuit, generally indicated PC, is associated with the regulation switch RSW.

In the embodiment shown by way of example, the protection circuit PC comprises a capacitor C connected to the gate of the regulation switch RSW by means of a resistor R1. The protection circuit PC also comprises a transistor T which, in the embodiment illustrated, is of the npn type. This transistor has its base connected, by means of a resistor R2, to the junction between the capacitor C and the resistor R1. The emitter of T is connected to ground and its collector is connected to the cathode of a diode D the anode of which is connected to the gate of the regulation switch RSW.

In operation, each time the square-wave control signal applied by the driver circuit DC to the gate of the regulation switch RSW is such as to render the latter conductive, the capacitor C is charged and the voltage at its terminals increases. The capacitance of this capacitor and the resistance of the resistor R1 are selected in a manner such that the voltage in the capacitor C causes the transistor T to become conductive only when the control signal applied to the gate of RSW remains continuously at a high level for a period of time longer than a predetermined period. In this case, the transistor T becomes conductive and causes the regulation switch RSW to be cut off.

If, however, the rotor R is accidentally stopped during the operation of the motor, there are basically two possibilities.

If the signal applied to the gate of RSW is at a low level when the rotor R stops, the regulation switch RSW is already cut off and the protection circuit PC does not intervene.

If, however, the signal applied to the gate of RSW is at a high level when the rotor R stops, this signal causes the capacitor C to be charged and, after a predetermined time, the voltage in the capacitor causes the transistor T to become conductive and to cut off the regulation switch RSW.

Figure 2:
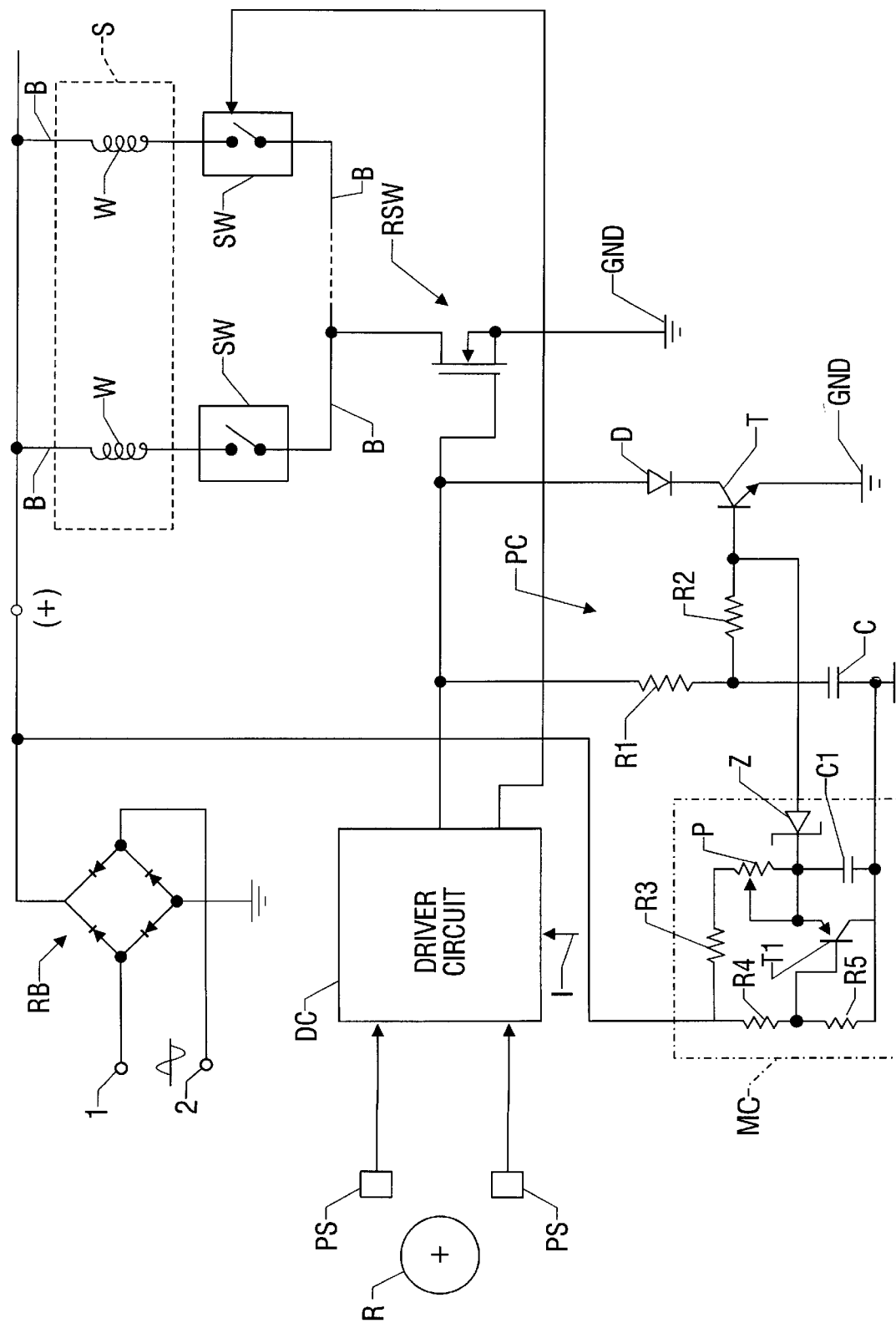
FIG. 2 is an electrical diagram, partially in block form, of a further embodiment of a control system according to the invention.

FIG. 2 shows a further embodiment of a control system according to the invention. In FIG. 2, parts and elements already described with reference to FIG. 1 have again been attributed the same alphanumeric reference symbols.

In the system according to FIG. 2, the direct-current supply voltage is produced by means of a full-wave diode rectifier bridge, generally indicated RB, the input terminals 1 and 2 of which are connected to a alternating-current voltage supply such as the normal mains voltage, with a frequency of 50 (60) Hz.

A modulator circuit, generally indicated MC, is connected to the output of the rectifier bridge RB. This modulator circuit comprises, basically, an RC circuit including a resistor R3 and a potentiometer P, connected to the output of the bridge RB, and an integrator capacitor C1 connected to ground.

In parallel with the capacitor C1 is a pnp transistor T1 the base of which is connected to a voltage divider formed by resistors R4 and R5 connected between the output of the rectifier bridge RB and ground. The non-grounded terminal of the capacitor C1 is connected to the cathode of a Zener diode Z the anode of which is connected to the base of the transistor T.

In operation, at the output of the rectifier bridge RB there is a direct-current voltage having a rectified sinusoidal waveform with an amplitude which becomes zero at a frequency twice that of the alternating mains voltage applied between the input terminals 1 and 2. For each half-wave of this voltage, the integrator capacitor C1 is charged through the resistor R3 and the potentiometer P and is then discharged by the transistor T1. The arrangement is such that, for each half-wave of the supply voltage, before the capacitor C1 is discharged, the voltage therein reaches a value which depends upon the amplitude of the supply voltage. In particular, when the amplitude of the supply voltage increases, the value reached by the voltage in the capacitor C1 increases.

The Zener diode Z operates as a comparator and applies to the base of the transistor T a square-wave signal with pulses the duration of which is modulated in dependence on the value reached by the voltage in the capacitor C1 and hence in dependence on the amplitude of the supply voltage. The transistor T is thus caused to switch in an on/off manner at a frequency equal to twice the frequency of the alternating mains voltage applied between the terminals 1 and 2.

Since, in general, the regulation switch RSW is driven by a square-wave signal with a frequency markedly lower than the frequency of the signal applied to the base of the transistor T the switching of the state of the latter intervenes to modify the mean conduction time of the regulation switch RSW.

With the modulator circuit MC and the associated transistor T it is therefore possible to stabilize the speed of rotation of the rotor R of the motor with variations in the amplitude of the supply voltage. It should be noted that this function is achieved in a synergetic manner with the use of the same transistor T which intervenes to switch off regulation switch RSW in the event of stoppage of the rotor R.

Figure 3:
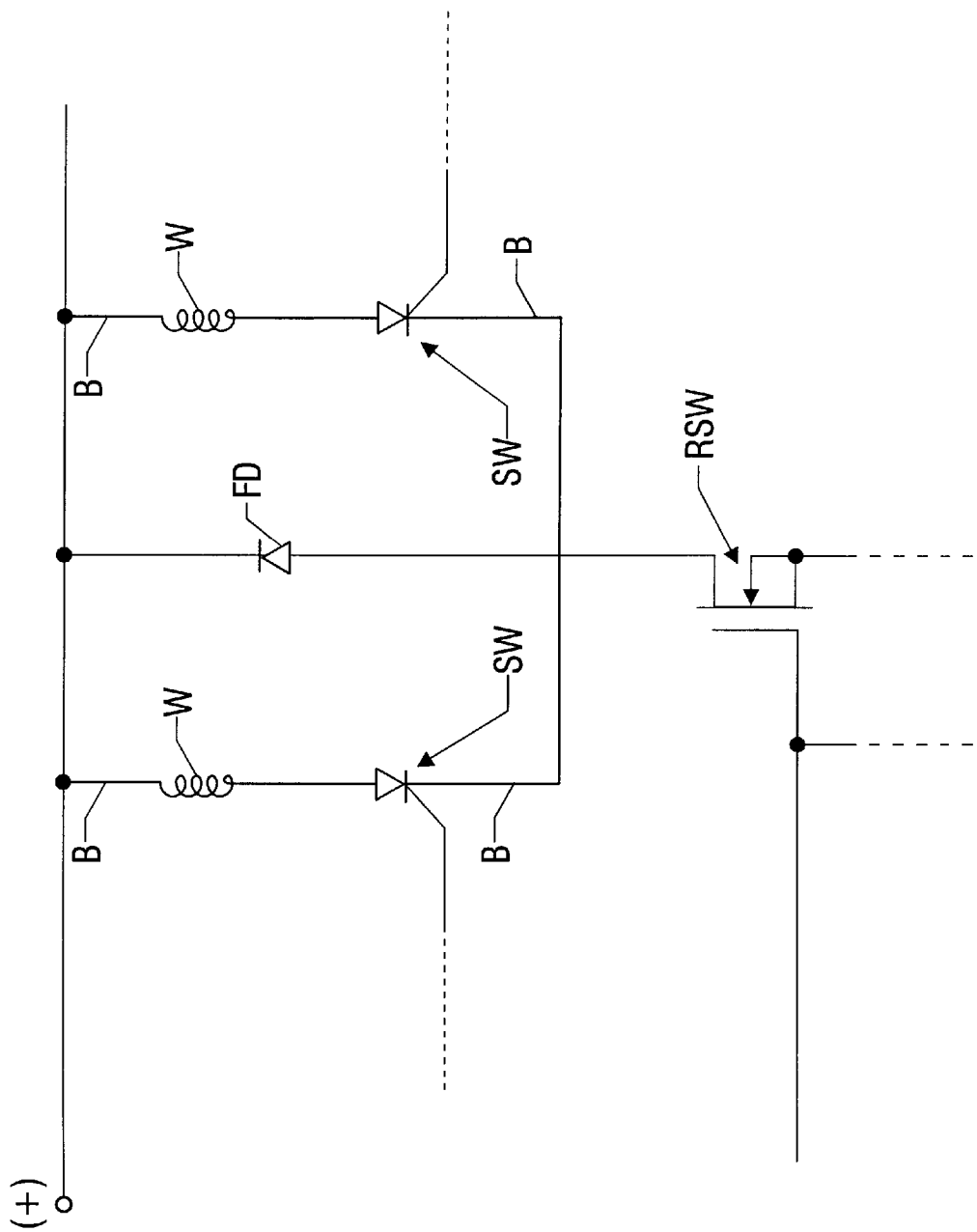
FIG. 3 is a partial electrical diagram of a control system according to the invention.

FIG. 3 of the appended drawings shows a portion of the control systems of FIGS. 1 and 2.

As shown in FIG. 3, the controlled electronic switches SW associated with each phase W of the motor are advantageously constituted by SCRs and a freewheeling diode is advantageously arranged in parallel with the circuit branches B including the phases of the motor in order to recirculate the current of each phase when the associated SCR is cut off.

The current which flows back from the phases when the associated controlled electronic switches are switched off does not therefore affect the regulation switch RSW.

Naturally, the principle of the invention remaining the same, the forms of embodiment and details of construction may be varied widely with respect to those described and illustrated purely by way of non-limiting example, without thereby departing from the scope of the invention as defined in the appended claims.

What is claimed is:

1. A system for controlling a brushless electric motor including a rotor, a stator, a plurality of stator windings disposed in the stator which are arranged in respective circuit branches and each of which is in series with a corresponding controlled electronic switch, the circuit branches being connected, at one end, to one pole of a direct-current voltage supply and, at the other end, to the other pole of the supply via an electronic regulation switch, the system comprising:

a position sensor for supplying electrical signals indicative of the angular position of the rotor;

a driver circuit arranged to control the controlled switches associated with the stator windings and the regulation switch in predetermined manner in dependence on the position signals emitted by the position sensor, the regulation switch being driven in an on/off manner by means of a square-wave signal;

a capacitor connected to a control input of the regulation switch so that the capacitor is charged each time the regulation switch is made conductive by the square-wave signal in operation, and a control switch connected between the control input of the regulation switch and the other pole of the direct-current voltage supply and having a control input connected to the capacitor, and so that the control switch is made conductive and cuts off the regulation switch when the regulation switch remains conductive continuously for a period of time longer than a predetermined period.

2. A system according to claim 1, in which the direct-current supply comprises a full-wave rectifier device coupled to a mains-frequency alternating voltage supply, and in which the square-wave control signal applied to the regulation switch has a frequency lower than the mains frequency, the system further comprising:

a modulator circuit adapted to apply to the control input of the regulator switch a pulsed signal with the same frequency as the direct-current voltage at the output of the rectifier device, with pulses the duration of which is correlated to the amplitude of the direct-current supply voltage so that, when the amplitude of the direct-current voltage increases (decreases), the time for which the regulation switch is conductive is reduced (increased).

3. A system according to claim 2, wherein the modulator circuit further comprises:

an integrator capacitor connected to the output of the rectifier device;

a switch connected in parallel with the integrator capacitor and driven by the full-wave rectified voltage at the output of the rectifier device; and a comparing device connected to the integrator capacitor for supplying to the control input of the control switch a signal which is at a first or a second predetermined level when the voltage in the integrator capacitor is greater than or less than a predetermined value, respectively.

4. A system according to claim 3, wherein the comparing device comprises a Zener diode.

5. A system according to claim 1, wherein the controlled electronic switch associated with each stator winding of the motor comprises an SCR, and wherein a freewheeling diode is arranged in parallel with the circuit branches including the stator windings.

* * * * *

UNITED STATES PATENT AND TRADEMARK OFFICE
CERTIFICATE OF CORRECTION

PATENT NO. : 6,060,848
DATED : May 9, 2000
INVENTOR(S) : Nicollino Alvaro, Sebastiano Acquaviva It is certified that error appears in the above-identified patent and that said Letters Patent is hereby corrected as shown below:

Inventors:
Nicolino Alvaro's city, please delete "Turin" and insert thereof --Torino--.

Foreign Application Priority Data:
Please delete "TO98A0028" and insert thereof --TO98A0000280--.

Signed and Sealed this

Third Day of July, 2001

*Attest:*

Nicholas P. Godici

NICHOLAS P. GODICI
*Attesting Officer*    *Acting Director of the United States Patent and Trademark Office*